United States Patent
Nomura et al.

(10) Patent No.: US 9,373,687 B2
(45) Date of Patent: Jun. 21, 2016

(54) LIGHT EMITTING CERAMIC SUBSTRATE INCLUDING GROUP-III NITRIDE

(71) Applicants: Koito Manufacturing Co., Ltd., Tokyo (JP); Tokyo University of Science, Tokyo (JP)

(72) Inventors: Akihiro Nomura, Shizuoka (JP); Kazuhiro Ohkawa, Tokyo (JP); Akira Hirako, Tokyo (JP)

(73) Assignees: KOITO MANUFACTURING CO., LTD., Minato-Ku, Tokyo (JP); TOKYO UNIVERSITY OF SCIENCE, Shinjuku-Ku, Tokyo (JP)

( * ) Notice: Subject to any disclaimer, the term of this patent is extended or adjusted under 35 U.S.C. 154(b) by 0 days.

(21) Appl. No.: 13/680,442

(22) Filed: Nov. 19, 2012

(65) Prior Publication Data

US 2013/0075754 A1  Mar. 28, 2013

Related U.S. Application Data

(62) Division of application No. 12/877,052, filed on Sep. 7, 2010, now abandoned.

(30) Foreign Application Priority Data

Sep. 25, 2009 (JP) .................. 2009-221212

(51) Int. Cl.
*H01L 33/00* (2010.01)
*H01L 29/20* (2006.01)
(Continued)

(52) U.S. Cl.
CPC ........ *H01L 29/2003* (2013.01); *H01L 21/0242* (2013.01); *H01L 21/0254* (2013.01);
(Continued)

(58) Field of Classification Search
None
See application file for complete search history.

(56) References Cited

U.S. PATENT DOCUMENTS 6,630,692 B2 * 10/2003 Goetz ................ C30B 25/02
257/101
6,973,115 B1 * 12/2005 Ferrand et al. .......... 372/92
(Continued)

FOREIGN PATENT DOCUMENTS

JP    02129913 A    5/1990
JP    09-134878     5/1997
(Continued)

OTHER PUBLICATIONS

JPO, Office Action in counterpart Japanese Patent Application No. 2009-221212 dated Jun. 18, 2013.
(Continued)

*Primary Examiner* — Benjamin Sandvik
(74) *Attorney, Agent, or Firm* — Buchanan Ingersoll & Rooney PC

(57) ABSTRACT

In a semiconductor device, a YAG substrate is formed as a single-crystal substrate of any of surface orientations (100), (110), and (111). In the fabrication of the semiconductor device, a TMAl gas is first fed onto the YAG substrate so as to form a nucleation layer made of aluminum, which is a group-III element. Then, an $NH_3$ gas is fed onto the nucleation layer. This turns the surface of the nucleation layer into a group-V element and then forms a group-III-V compound layer of AlN. Then, a mixed gas of TMAl gas and $NH_3$ gas is fed onto the group-III-V compound layer so as to form another group-III-V compound layer. Finally, a group-III nitride semiconductor layer is crystal-grown on the group-III compound layer.

11 Claims, 18 Drawing Sheets

(51) Int. Cl.
*H01L 21/02* (2006.01)
*H01L 21/20* (2006.01)

(52) U.S. Cl.
CPC ...... *H01L21/0262* (2013.01); *H01L 21/02433* (2013.01); *H01L 21/02458* (2013.01); *H01L 21/02614* (2013.01); *H01L 21/20* (2013.01); *H01L 33/007* (2013.01); *H01L 33/0066* (2013.01)

(56) References Cited

U.S. PATENT DOCUMENTS

| | | | |
|---|---|---|---|
| 7,250,360 | B2 | 7/2007 | Shealy et al. |
| 2002/0003233 | A1 | 1/2002 | Mueller-Mach et al. |
| 2006/0088067 | A1* | 4/2006 | Vetrovec et al. ............ 372/21 |
| 2006/0160345 | A1 | 7/2006 | Liu et al. |
| 2008/0138919 | A1* | 6/2008 | Mueller ............... C04B 35/44 438/27 |
| 2008/0283853 | A1 | 11/2008 | Mitani et al. |
| 2009/0057646 | A1* | 3/2009 | Hirayama ......... H01L 21/0237 257/13 |
| 2009/0057688 | A1* | 3/2009 | Hirayama ......... H01L 21/0242 257/86 |

FOREIGN PATENT DOCUMENTS

| | | |
|---|---|---|
| JP | 2003-204080 | 7/2003 |
| JP | 2006-005367 | 1/2006 |
| JP | 2007-201151 A | 8/2007 |
| WO | 2009031696 A1 | 3/2009 |

OTHER PUBLICATIONS

Office Action (Decision of Refusal) issued on Dec. 17, 2013, by the Japanese Patent Office in corresponding Japanese Patent Application No. 2009-221212, and an English Translation of the Office Action. (5 pages).

Notification of Reason(s) for Refusal dispatched Mar. 10, 2015 for Japanese Patent Appln. No. 2014-052131.

Official Action dated Dec. 2, 2014 for corresponding JP Application No. 2014-052131.

* cited by examiner

FIG. 4A
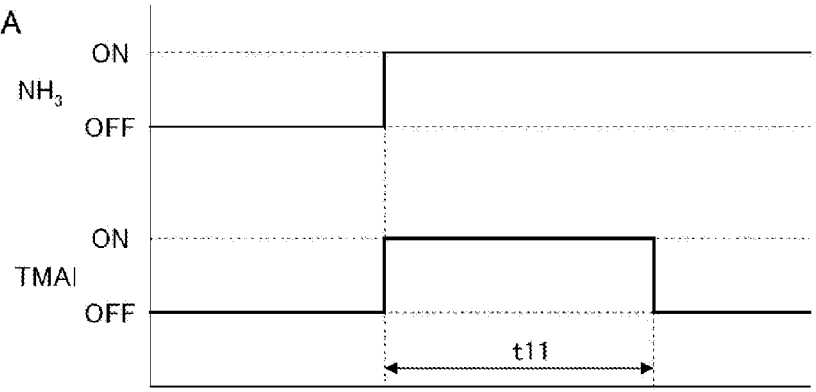
FIG. 4B
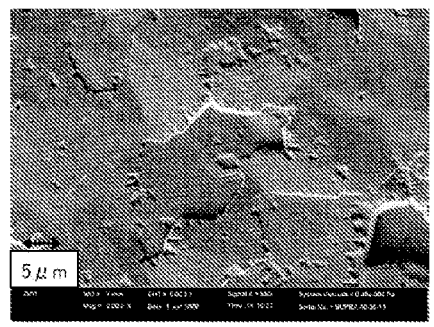
FIG. 4C

FIG. 18
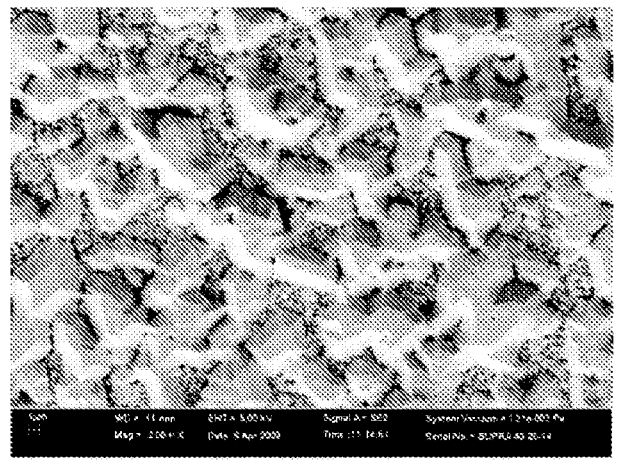
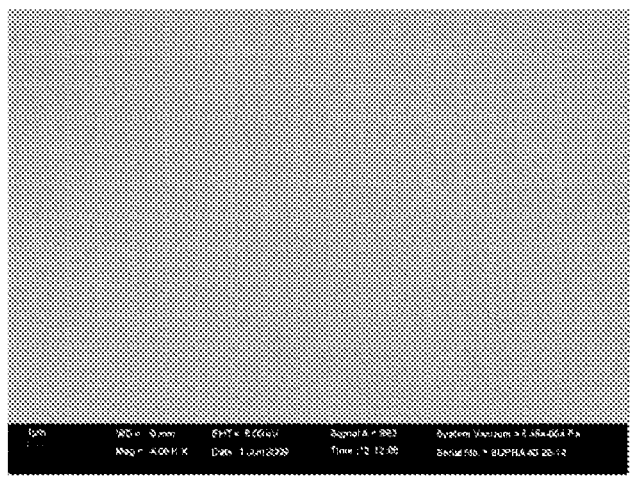
FIG. 19A
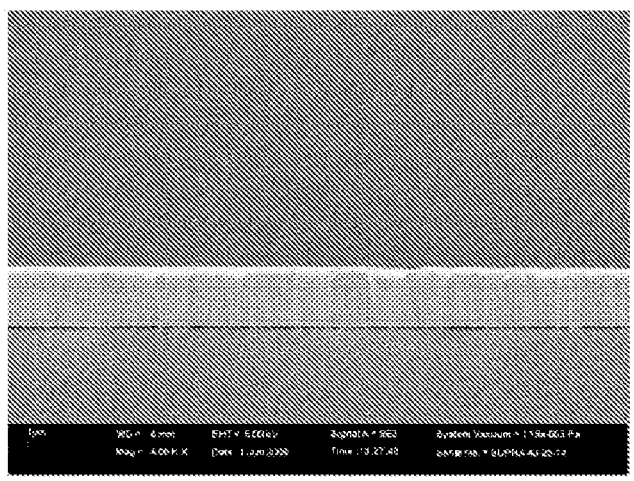
FIG. 19B

LIGHT EMITTING CERAMIC SUBSTRATE INCLUDING GROUP-III NITRIDE

CROSS-REFERENCE TO RELATED APPLICATION

This Divisional application is based on U.S. Ser. No. 12/877,052, filed on Sep. 7, 2010; which is based upon and claims the benefit of priority from the prior Japanese Patent Application No. 2009-221212, filed on Sep. 25, 2009, the entire contents of which are incorporated herein by reference.

BACKGROUND OF THE INVENTION

1. Field of the Invention

The present invention relates to a semiconductor device and a method for fabricating the semiconductor devices and, more particularly, to a semiconductor device having a substrate made of $Y_3Al_5O_{12}$ and a group-III nitride semiconductor layer and a fabrication method thereof.

2. Description of the Related Art

Recent years have seen a spate of active development of technologies using phosphor materials designed to obtain light emitting modules for emitting white light, for instance, using a light emitting device such as an LED (light emitting diode). For example, it is possible to produce white light by placing a phosphor material, which can be excited by blue light to emit yellow light, on an LED that emits blue light. In this regard, Japanese Unexamined Patent Application Publication No. 2006-5367 (Reference (1) in the Related Art List below) proposes a structure having a ceramic layer disposed within the path of light emitted from a light emitting layer, for instance.

For example, Reference (1) discloses bonding as a way of attaching a phosphor material, which has been formed into a sheet-like ceramic layer or the like, to a light emitting layer. However, the bonding layer is liable to degradation from exposure to the light from the light emitting layer. Also, the bonding layer can develop voids therewithin, and the presence of voids may cause a decrease in the light extraction efficiency. And, provision of a bonding layer whose refractive index is relatively low may also cause a decrease in the light extraction efficiency. Also, since the light transmissibility of the bonding layer is lower than 100%, the light passing through the bonding layer may possibly contribute to a decline in the light extraction efficiency. Further, a step of bonding is required aside from the step of allowing crystal growth of a semiconductor layer on a growth substrate. Moreover, there is need for an expensive substrate of sapphire, SiC, or the like for crystal growth thereon in addition to the phosphor material, which has been formed into a sheet-like ceramic layer or the like.

As a measure to solve the above-mentioned drawbacks, the above-cited patent publication of Reference (1) proposes a technology in which a group-III nitride nucleation layer is deposited at low temperature directly on a ceramic layer and further a buffer layer of GaN (gallium nitride) is deposited at high temperature thereon. According to this patent publication, it is possible to eliminate harmful influences of lattice mismatch by inserting multiple low-temperature intermediate layers between YAGs (see below) and the GaN buffer layers. Also, Japanese Unexamined Patent Application Publication No. 2003-204080 (Reference (2) in the Related Art List below), for instance, proposes a nitride semiconductor device in which a buffer layer is formed on a substrate formed of $Y_3Al_5O_{12}$ of surface orientation (111) (hereinafter referred to as YAG (Yttrium Aluminum Garnet) as appropriate) and a group-III nitride semiconductor layer is formed on the buffer layer.

RELATED ART LIST (1) Japanese Unexamined Patent Application Publication No. 2006-5367.
(2) Japanese Unexamined Patent Application Publication No. 2003-204080.

However, as disclosed in the first-cited Reference (1), many steps must be taken if multiple layers are to be deposited on the ceramic layer before the growth of a light emitting layer. There is thus room for improvement in productivity in the fabrication of the light emitting module. Also, the technology disclosed in the second-cited Reference (2) assumes the use of a substrate formed of YAG of surface orientation (111). Yet, YAG exists in surface orientations other than (111) as well, and there is also much demand for the use of YAG of polycrystalline structure in this field of art.

SUMMARY OF THE INVENTION

The present invention has been made to solve problems as described above, and a purpose thereof is to provide a technology for forming a group-III nitride semiconductor layer in simple steps for any of YAGs having a plurality of surface orientations.

To resolve the foregoing problems, a method, for fabricating a semiconductor device, according to one embodiment of the present invention comprises: forming a buffer layer, containing a group-III-V compound, on a substrate formed of $Y_3Al_5O_{12}$; and forming a group-III nitride semiconductor layer on the buffer layer. The forming the buffer layer includes forming a nucleation layer made of a group-III element on the substrate.

BRIEF DESCRIPTION OF THE DRAWINGS

Embodiments will now be described by way of examples only, with reference to the accompanying drawings which are meant to be exemplary, not limiting and wherein like elements are numbered alike in several Figures in which:

FIG. 4A is a diagram showing the feed timing of TMAl gas and $NH_3$ gas when fabricating a semiconductor device of Comparative Example 1;

FIG. 4B is a photo of a surface of a semiconductor device of Comparative Example 1;

FIG. 4C is a photo of a cross section of a semiconductor device of Comparative Example 1;

FIG. 18 is a photo of a surface of a semiconductor device of Comparative Example 5 using a YAG substrate of surface orientation (110);

FIG. 19A is a photo of a surface of a semiconductor device according to a first embodiment using a YAG substrate of surface orientation (110);

FIG. 19B is a photo of a cross section of the semiconductor device of FIG. 19A;

DETAILED DESCRIPTION OF THE INVENTION

The invention will now be described by reference to the preferred embodiments. This does not intend to limit the scope of the present invention, but to exemplify the invention. Hereinbelow, the embodiments will now be described in detail with reference to drawings.

First Embodiment

Figure 1:
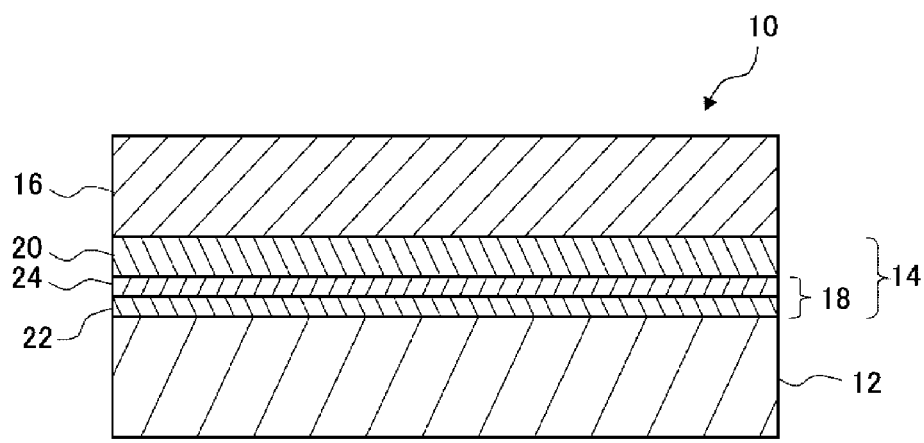
FIG. 1 is a cross-sectional view of a semiconductor device according to a first embodiment of the present invention.

FIG. 1 is a cross-sectional view of a semiconductor device 10 according to a first embodiment of the present invention. The semiconductor device 10 includes a YAG substrate 12, a buffer layer 14, and a group-III nitride semiconductor layer 16.

The YAG substrate 12 is what is generally called a light emitting ceramic or a fluorescent ceramic. It can be produced by sintering a ceramic green body made from the powder of YAG (Yttrium Aluminum Garnet), or $Y_3Al_5O_{12}$, which is a fluorescent material capable of being excited by blue light. The YAG substrate 12 thus produced emits yellow light by converting a wavelength of blue light. Hence, a semiconductor device 10 that emits white light as a synthesized light of blue and yellow through an additive color mixing can be formed by combining the YAG substrate 12 with a semiconductor layer emitting blue light.

In the first embodiment, the YAG substrate 12 is formed into a plate shape. Also, the YAG substrate 12 to be employed is a single-crystal substrate of any of surface orientations (100), (110), and (111) or a polycrystalline substrate of a plurality of surface orientations.

The YAG substrate 12 may be such that part of Y of $Y_3Al_5O_{12}$ is replaced by any of Lu, Sc, La, Gd, and Sm and/or part of Al is replaced by any of In, B, Tl, and Ga. Also, the YAG substrate 12 may contain at least one type of activator selected from the group consisting of Ce, Tb, Eu, Ba, Sr, Mg, Ca, Zn, Si, Cu, Ag, Au, Fe, Cr, Pr, Nd, Dy, Co, Ni, and Ti. It is to be noted that Ce may be $Ce^{3+}$, Tb may be $Tb^{2+}$, and Eu may be $Eu^{2+}$.

Also, the YAG substrate 12 is so formed as to be transparent. In the first embodiment, the term "transparent" or "transparency" should be understood to mean that the total light transmission in the converted wavelength range is 40% or above. As a result of diligent R&D efforts by the inventors, it has been found that as long as the transparency is at a total transmission of light in the converted wavelength range of 40% or above, the wavelength of light can be properly converted by the YAG substrate 12 and the decrease in light emitted from the YAG substrate 12 can be controlled properly. Therefore, with the YAG substrate 12 having a transparency as described above, the light emitted by the semiconductor layer can be converted efficiently.

Also, the YAG substrate 12 is formed of an inorganic material, which is free of any organic binder, and is therefore more durable than when it contains organic materials such as organic binder. Consequently, an electric power of 1 watt or above, for instance, can be applied to the light emitting module, thereby raising the brightness, luminosity, and luminous flux of the light to be produced by the light emitting module.

The buffer layer 14, which contains a group-III-V compound, is formed on the YAG substrate 12. The buffer layer 14 functions as a relaxation layer to effect the single crystal growth of a group-III nitride semiconductor layer 16. Therefore, it is formed on the YAG substrate 12 before the single crystal growth of the group-III nitride semiconductor layer 16.

The buffer layer 14 has a nucleation layer 18 and a group-III-V compound layer 20. For the semiconductor device 10 according to the first embodiment, the nucleation layer 18 is formed on the surface of the YAG substrate 12 before the group-III-V compound layer 20 is formed, so that the group-III nitride semiconductor layer 16 can be formed properly whatever YAG substrate 12 having a plurality of surface orientations is used.

The nucleation layer 18 is first formed of aluminum on the YAG substrate 12. It should be appreciated here that the nucleation layer 18 may be formed of another group-III element. The nucleation layer 18 may also be formed of one or more of Al, Ga, and In as the group-III elements.

In the first embodiment, the surface of the nucleation layer 18 is turned into a group-V compound by a group-V element. As a result, the nucleation layer 18 includes a group-III nucleation layer 22 left there without being combined with the group-V element and a group-III-V compound layer 24 with the surface of the nucleation layer 18, which was once formed of the group-III element, now formed by being combined with a group-V element.

The group-III-V compound layer 20 is formed on the nucleation layer 18. The group-III nitride semiconductor layer 16 is formed through a process of single crystal growth on the surface of the thus formed buffer layer 14.

Figure 2:
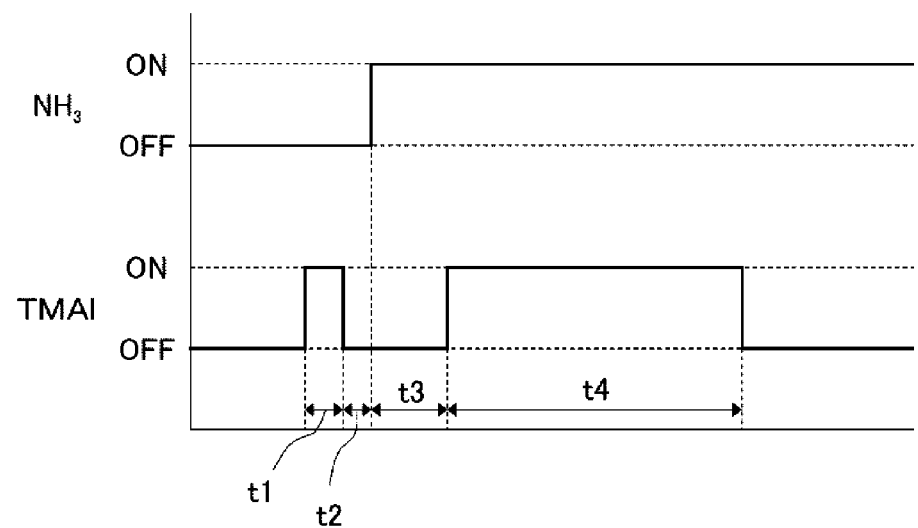
FIG. 2 is a diagram showing the feed timing of TMAl gas and $NH_3$ gas when forming a buffer layer according to a first embodiment of the present invention.

FIG. 2 is a diagram showing the feed timing of TMAl (trimethylaluminum) gas and $NH_3$ gas when forming the buffer layer 14 according to the first embodiment. In the first embodiment, the buffer layer 14 is formed by a MOCVD (metal organic chemical vapor deposition) process. FIG. 2 shows the feed timing of the TMAl gas and the feed timing of the $NH_3$ gas in this MOCVD process. FIGS. 3A to 3D illustrate the fabrication processes of a semiconductor device 10 according to the embodiment of FIG. 1. Hereinbelow, a method for fabricating the semiconductor device 10 is explained in conjunction with FIG. 2 and FIGS. 3A to 3D.

As shown in FIG. 2, in the first embodiment, the TMAl gas is first fed in pulses onto the YAG substrate 12 without allowing the $NH_3$ gas to be exposed to the surface of the YAG substrate 12. Let t1 represent this pulse feeding time. When time t2 has elapsed from the end of pulse feeding of the TMAl gas, the feeding of the $NH_3$ gas is started. When time t3 has elapsed from the start of the $NH_3$ gas feeding, the feeding of the TMAl gas is started again. This will supply a mixed gas of TMAl gas and $NH_3$ gas onto the YAG substrate 12. Let t4 represent the feeding time of TMAl gas at this time. Note that either or both of $H_2$ and $N_2$ are used as the carrier gas for the TMAl gas and the carrier gas for $NH_3$ gas.

Figure 3A:
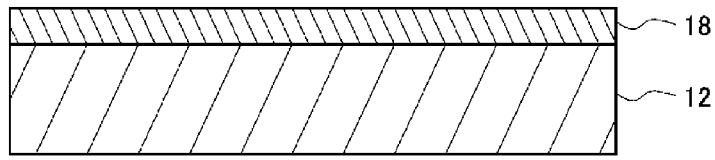
FIGS. 3A to 3D illustrate fabrication processes of a semiconductor device according to a first embodiment of the present invention.

FIGS. 3A to 3D illustrate the fabrication processes of a semiconductor device 10 according to the first embodiment of the present invention. FIG. 3A is an illustration showing a state in which a nucleation layer 18 has been formed on the surface of a YAG substrate 12. In the first embodiment, the semiconductor device 10 is fabricated such that the nucleation layer 18, which is made of aluminum, is formed on the YAG substrate 12 by pulse-feeding a TMAl gas containing aluminum, which is a group-III element, onto the surface of the YAG substrate 12 for a pulse feeding time t1. It is to be noted that the nucleation layer 18 may be formed by another film-forming method such as sputtering or vacuum deposition.

Figure 3B:
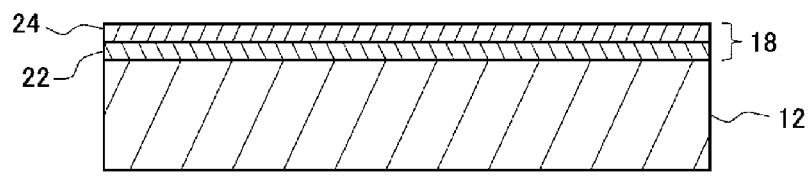

[FIG. 3B is an illustration showing a state in which the surface of the nucleation layer 18 has been nitrided. After an elapse of t2 from the end of pulse feeding of the TMAl gas, an $NH_3$ gas is now fed onto the nucleation layer 18. By this step, the surface of the nucleation layer 18 is nitrided, which results in the formation of a group-III-V compound layer 24 by changing the surface of the nucleation layer 18 into AlN (aluminum nitride), which is a group-III-V compound. And the part that has remained aluminum without being nitrided is a group-III nucleation layer 22. It should be noted that nitridation of the nucleation layer 18 may be kept up until there is no longer group-III nucleation layer 22 remaining. Also, at least a part of the surface of the nucleation layer 18 may be combined with a group-V element by feeding a gas containing a group-V element other than nitrogen onto the nucleation layer 18.

Figure 3C:
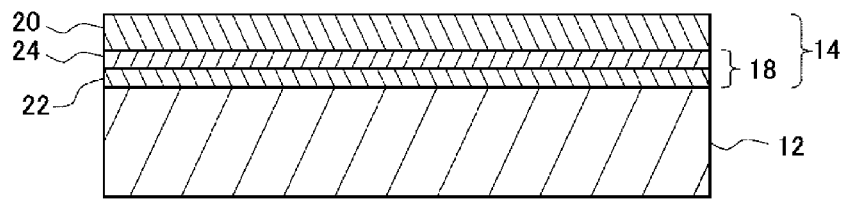

FIG. 3C is an illustration showing a state in which a group-III-V compound layer 20 has been formed on the nucleation layer 18. When time t3 has elapsed from the start of $NH_3$ gas feeding, the feeding of TMAl gas is started again. In this manner, a mixed gas of TMAl gas containing aluminum, which is a group-III element, and $NH_3$ gas containing nitrogen, which is a group-V element, is fed onto the nucleation layer 18, so that the group-III-V compound layer 20 of AlN is stacked on the nucleation layer 18.

Thus a buffer layer 14 is constituted by the nucleation layer 18 and the group-III-V compound layer 20. It should be noted that a plurality of buffer layers 14 may also be formed between the YAG substrate 12 and the group-III nitride semiconductor layer 16 by forming another buffer layer 14 on top of the buffer layer 14.

Figure 3D:
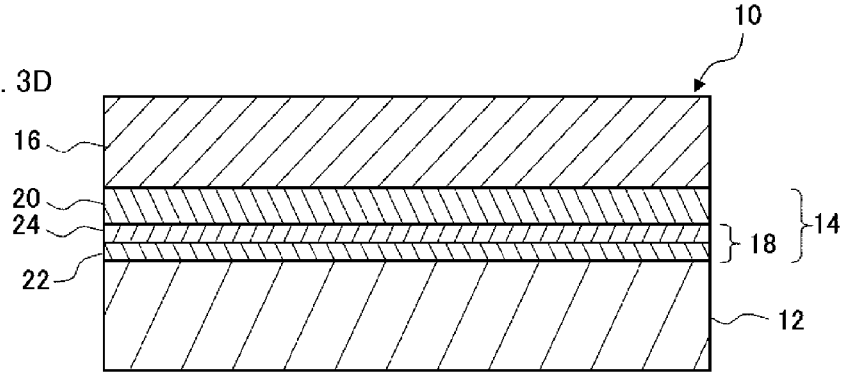

FIG. 3D is an illustration showing a state in which a group-III nitride semiconductor layer 16 has been formed on the buffer layer 14. The group-III nitride semiconductor layer 16 is formed by growing the crystal of $In_xAl_yGa_{(1-x-y)}N$ ($0 \leq x \leq 1$, $0 \leq y \leq 1$, $0 \leq x+y \leq 1$) on the buffer layer 14 using an epitaxial growth method. The group-III nitride semiconductor layer 16 is provided such that it emits light covering at least a part of the wavelength range when a voltage is applied. Specifically, $In_xAl_yGa_{(1-x-y)}N$ is first doped with an n-type impurity so as to allow a semiconductor layer to grow on the buffer layer 14. Through this process, an n-type semiconductor layer is formed on the buffer layer 14. Next, the $In_xAl_yGa_{(1-x-y)}N$ is doped with a p-type impurity so as to further grow the semiconductor layer thereon. It is to be noted here that a quantum well light emitting layer may be provided between the n-type semiconductor layer and the p-type semiconductor layer. Also, ELO (epitaxial lateral overgrowth) may be employed as the epitaxial growth method.

MOCVD is used to carry out the crystal growth of these semiconductor layers. However, it is evident to those skilled in the art that the crystal growth technique is not limited to MOCVD, but an MBE (molecular beam epitaxy) method may be used for the crystal growth of those semiconductor layers.

After this, a part of the p-type semiconductor layer is removed by etching to expose a part of the upper surface of the n-type semiconductor layer. Electrodes are formed on the exposed upper surface of the n-type semiconductor layer and the upper surface of the p-type semiconductor layer. Finally, the prepared stack is diced into semiconductor devices 10 of proper size. In the first embodiment, the dicing produces semiconductor devices 10 of 1 mm rectangle. The group-III nitride semiconductor layer 16 thus formed functions as a semiconductor light emitting device when a voltage is applied thereto. The first embodiment improves productivity in the fabrication of light emitting modules by eliminating the step of bonding the YAG substrate 12 to the group-III nitride semiconductor layer 16. Also, the first embodiment can reduce cost by doing away with the expensive sapphire substrate or SiC substrate.

Comparative Example 1

FIG. 4A is a diagram showing the feed timing of TMAl gas and $NH_3$ gas when fabricating a semiconductor device of Comparative Example 1. The semiconductor device of Comparative Example 1 is fabricated by the same method as for the semiconductor device 10 according to the first embodiment with the exception of the method for forming the buffer layer.

In Comparative Example 1, the TMAl gas is not pulse-fed to the surface of the YAG substrate 12, and the $NH_3$ gas is not fed thereto, either. In Comparative Example 1, a mixed gas of TMAl gas and $NH_3$ gas is fed to the surface of the YAG substrate 12. The feeding time of the TMAl gas at this time, represented by t11, is 600 seconds in Comparative Example 1. In this manner, a buffer layer is formed on the YAG substrate 12, and the crystal of the group-III nitride semiconductor layer 16 is grown further thereon.

[FIG. 4B is a photo of a surface of the semiconductor device of Comparative Example 1, and FIG. 4C a photo of a cross section of the semiconductor device of Comparative Example 1. As is clear from FIG. 4B and FIG. 4C, the surface of the GaN layer, which is the group-III nitride semiconductor layer 16 of Comparative Example 1, is uneven.

Figure 5A:
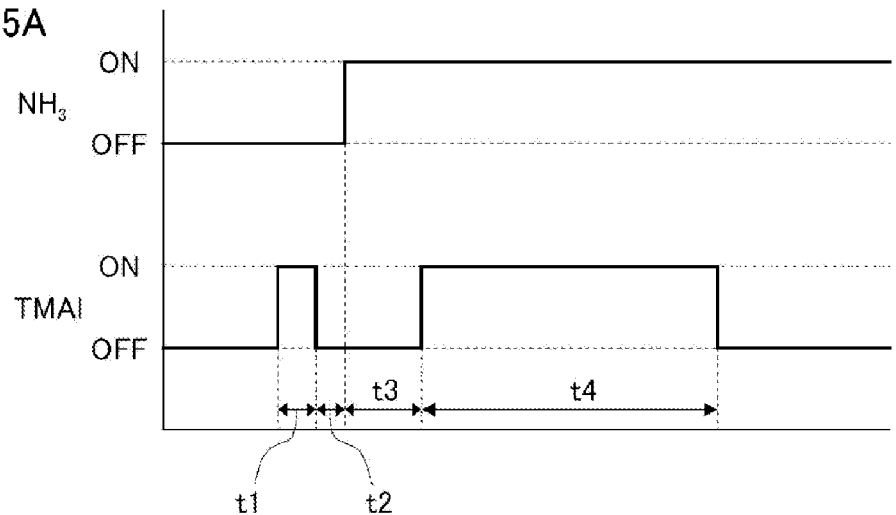
FIG. 5A is a diagram showing the feed timing of TMAl gas and $NH_3$ gas when forming a buffer layer of a first embodiment.

FIG. 5A is a diagram showing the feed timing of TMAl gas and $NH_3$ gas when forming a buffer layer 14 of the first embodiment. When the semiconductor device 10 was fabricated for comparison with Comparative Example 1, t1 was 15 seconds, t2 was one minute, t3 was 5 minutes, and t4 was 600 seconds.

Figure 5B:
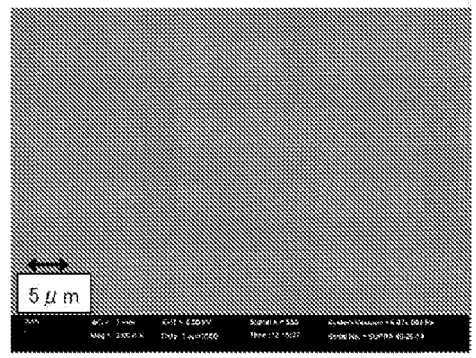
FIG. 5B is a photo of a surface of a semiconductor device of a first embodiment.
Figure 5C:
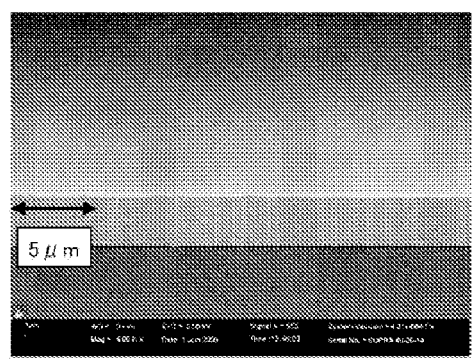
FIG. 5C is a photo of a cross section of a semiconductor device of a first embodiment.

FIG. 5B is a photo of a surface of the semiconductor device 10 of the first embodiment, and FIG. 5C a photo of a cross section of the semiconductor device 10 of the first embodiment. As is clear from FIG. 5B and FIG. 5C, there is little unevenness visible on the surface of the GaN layer of the semiconductor device 10, indicating that the crystal growth of the group-III nitride semiconductor layer 16 has been better done than Comparative Example 1.

Comparative Example 2

Figure 6A:
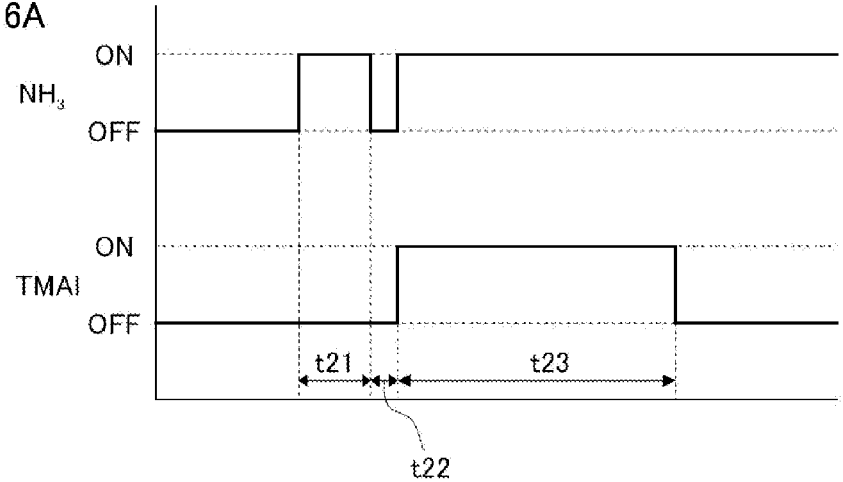
FIG. 6A is a diagram showing the feed timing of TMAl gas and NH₃ gas when forming a buffer layer of a semiconductor device of Comparative Example 2.

FIG. 6A is a diagram showing the feed timing of TMAl gas and $NH_3$ gas when forming a buffer layer of a semiconductor device of Comparative Example 2. The semiconductor device of Comparative Example 2 is also fabricated by the same method as for the semiconductor device 10 according to the first embodiment with the exception of the method for forming the buffer layer.

In Comparative Example 2, the surface of the YAG substrate 12 is first exposed to $NH_3$ gas for t21. In Comparative Example 2, t21 is 5 minutes. When t22 has elapsed after the end of exposure to $NH_3$ gas, a mixed gas of TMAl gas and $NH_3$ gas is fed onto the YAG substrate 12 for t23. In Comparative Example 2, t22 is one minute and t23 is 600 seconds.

Figure 6B:
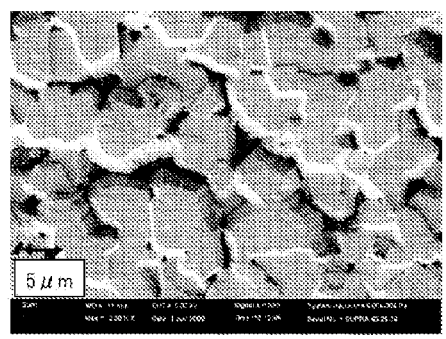
FIG. 6B is a photo of a surface of a semiconductor device of Comparative Example 2.
Figure 6C:
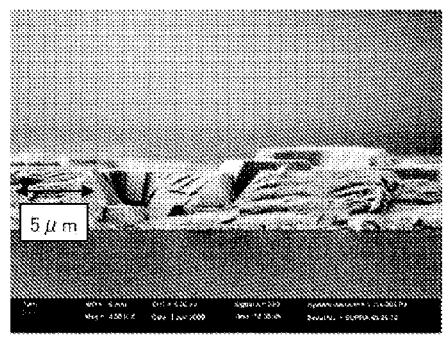
FIG. 6C is a photo of a cross section of a semiconductor device of Comparative Example 2.

FIG. 6B is a photo of a surface of the semiconductor device of Comparative Example 2, and FIG. 6C a photo of a cross section of the semiconductor device of Comparative Example 2. As is clear from FIG. 6B and FIG. 6C, the exposure of the surface of the YAG substrate 12 to $NH_3$ gas before a mixed gas of TMAl gas and $NH_3$ gas is fed thereto results in greater unevenness of the surface of the GaN layer than the case shown in FIG. 4B and FIG. 4C which does not involve the exposure of the surface of the YAG substrate 12 to $NH_3$ gas. This indicates that the surface of the YAG substrate 12 should not be exposed to $NH_3$ gas if the group-III nitride semiconductor layer 16 is to be formed properly.

Comparative Example 3

Figure 7A:
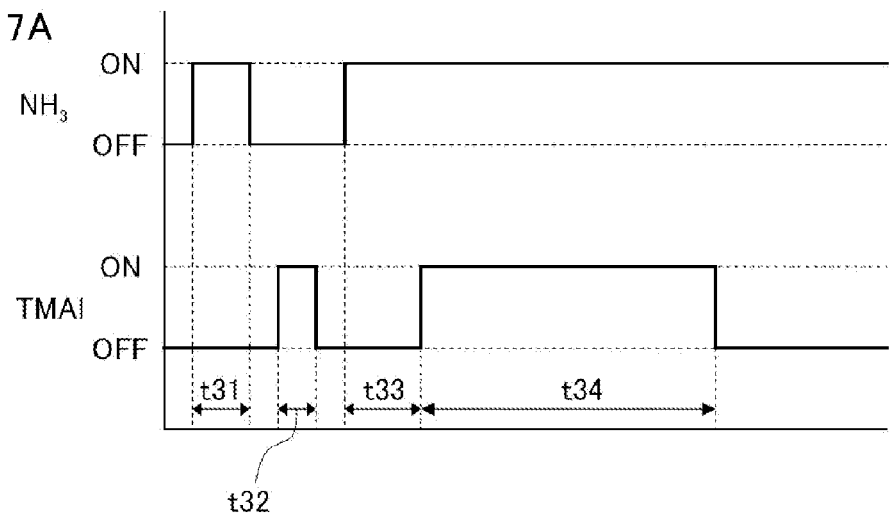
FIG. 7A is a diagram showing the feed timing of TMAl gas and NH₃ gas when forming a buffer layer of a semiconductor device of Comparative Example 3.

FIG. 7A is a diagram showing the feed timing of TMAl gas and $NH_3$ gas when forming a buffer layer of a semiconductor device of Comparative Example 3. In Comparative Example 3, $NH_3$ gas is first fed to the surface of the YAG substrate 12 for t31. After a short time from the end of this exposure to the $NH_3$ gas, TMAl gas is now pulse-fed for t32. After the end of pulse feeding of the TMAl gas, $NH_3$ gas only is fed for t33. When t33 has elapsed from the start of feeding $NH_3$ gas, the feeding of TMAl gas is started and a mixed gas of TMAl gas and $NH_3$ gas is fed for t34. In Comparative Example 3, t31 is 5 minutes, t32 is 15 seconds, t33 is 5 minutes, and t34 is 600 seconds.

Figure 7B:
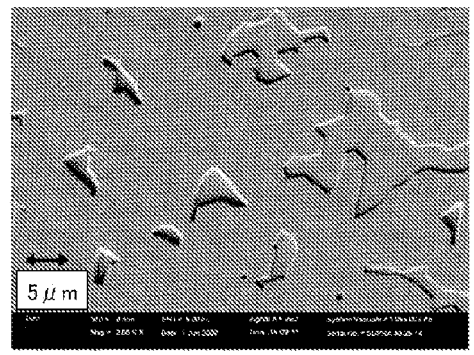
FIG. 7B is a photo of a surface of a semiconductor device of Comparative Example 3.
Figure 7C:
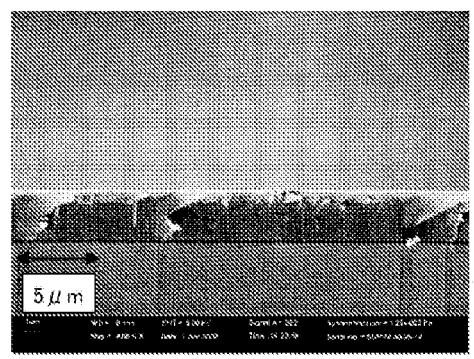
FIG. 7C is a photo of a cross section of a semiconductor device of Comparative Example 3.

FIG. 7B is a photo of a surface of the semiconductor device of Comparative Example 3, and FIG. 7C a photo of a cross section of the semiconductor device of Comparative Example 3. As is clear from FIG. 7B and FIG. 7C, the TMAl gas pulse-fed even after the exposure of the surface of the YAG substrate 12 to $NH_3$ gas reduces the unevenness of the surface of the GaN layer substantially from the case shown in FIG. 6B and FIG. 6C.

Comparative Example 4

Figure 8:
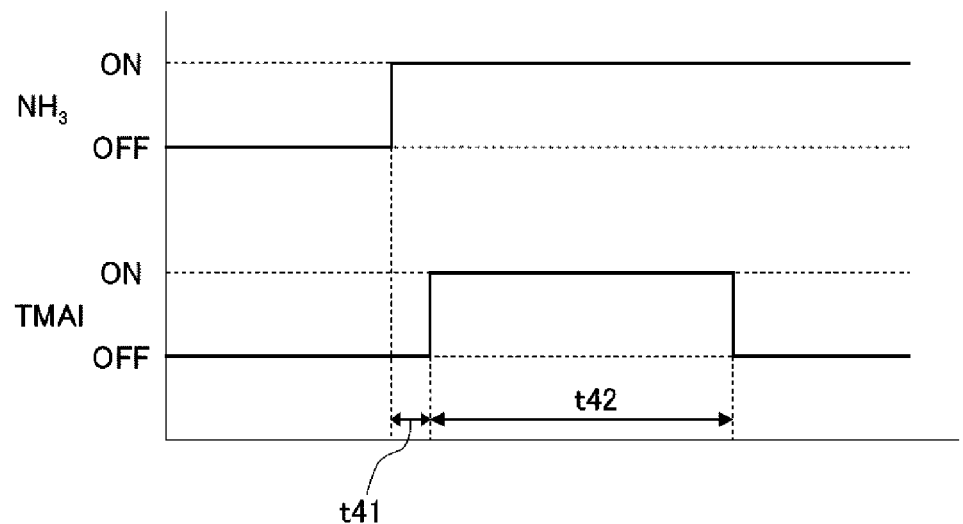
FIG. 8 is a diagram showing the feed timing of TMAl gas and NH₃ gas when forming a buffer layer of a semiconductor device of Comparative Example 4.

FIG. 8 is a diagram showing the feed timing of TMAl gas and $NH_3$ gas when forming a buffer layer of a semiconductor device of Comparative Example 4. An attempt was made to find an optimum time for t2 as shown in FIG. 2 by observing changes in the surface of the GaN layer with changes in t2. At the same time, they were compared with the surface of the GaN layer of Comparative Example 4.

In Comparative Example 4, NH₃ gas is first fed to the surface of the YAG substrate 12 for t41. After that, the feeding of TMAl gas is started and a mixed gas of TMAl gas and NH₃ gas is fed to the YAG substrate 12 for t42. In Comparative Example 4, t41 is 30 seconds, and t42 is 600 seconds.

Figure 9A:
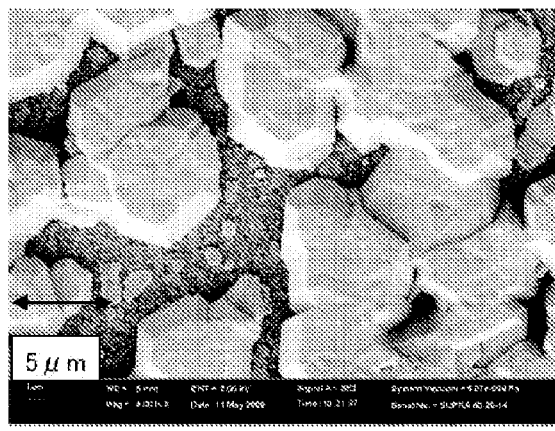
FIG. 9A is a photo of a surface of a semiconductor device of Comparative Example 4.
Figure 9B:
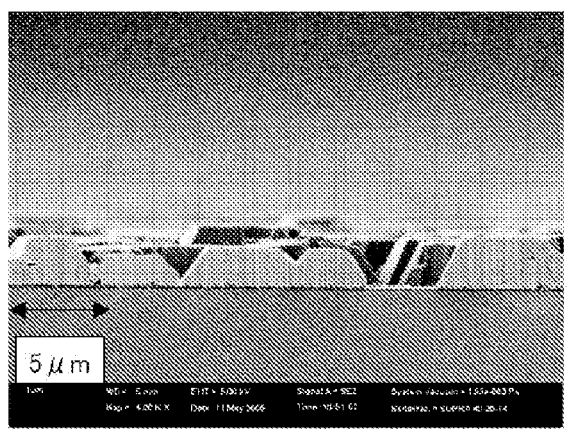
FIG. 9B is a photo of a cross section of a semiconductor device of Comparative Example 4.

FIG. 9A is a photo of a surface of the semiconductor device of Comparative Example 4, and FIG. 9B a photo of a cross section of the semiconductor device of Comparative Example 4. As is clear from FIG. 9A and FIG. 9B, the surface of the GaN layer shows a marked unevenness.

Figure 10A:
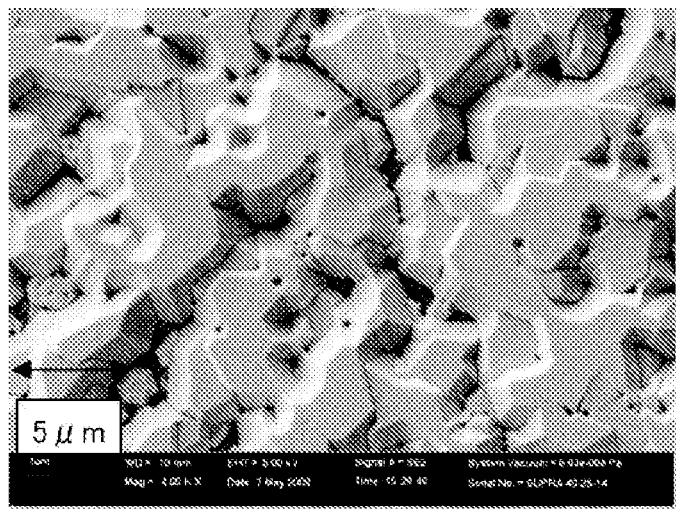
FIG. 10A is a photo of a surface of a semiconductor device of a first embodiment, for which a buffer layer was formed with the feed timing of TMAl gas and NH₃ gas as shown in FIG. 2 and the pulse feeding time $t_1$ of TMAl gas of 5 seconds.
Figure 10B:
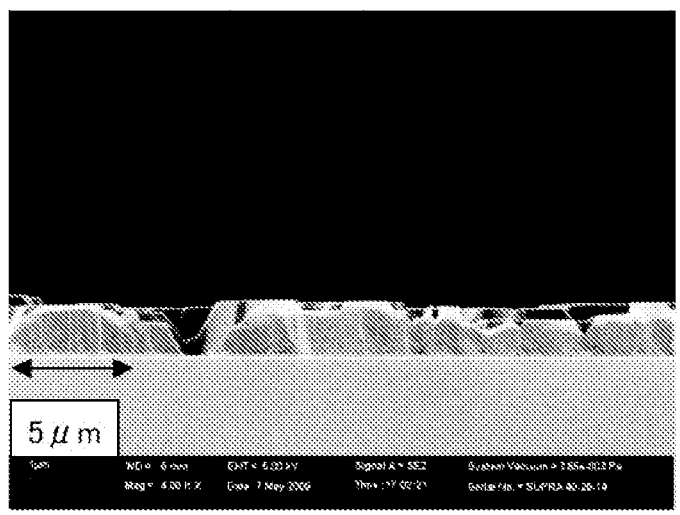
FIG. 10B is a photo of a cross section of a semiconductor device in the case of FIG. 10A.

FIG. 10A is a photo of a surface of the semiconductor device 10 according to the first embodiment, for which the buffer layer was formed with the feed timing of TMAl gas and NH₃ gas as shown in FIG. 2 and the pulse feeding time t1 of TMAl gas of 5 seconds, and FIG. 10B a photo of a cross section of the semiconductor device 10 in this case. As other conditions, t3 and t4 of FIG. 2 were 5 minutes, and 600 seconds, respectively.

Figure 11A:
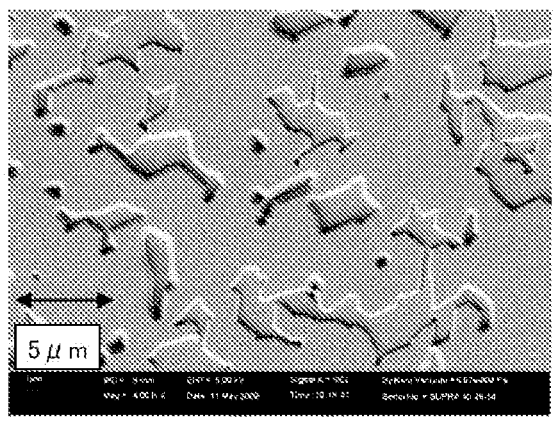
FIG. 11A is a photo of a surface of a semiconductor device of a first embodiment, for which a buffer layer was formed with the feed timing of TMAl gas and NH₃ gas as shown in FIG. 2 and the pulse feeding time $t_1$ of TMAl gas of 10 seconds.
Figure 11B:
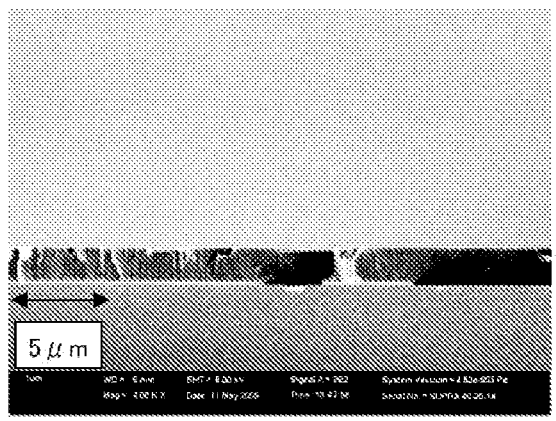
FIG. 11B is a photo of a cross section of a semiconductor device in the case of FIG. 11A.

FIG. 11A is a photo of a surface of the semiconductor device 10 according to the first embodiment, for which the buffer layer was formed with the feed timing of TMAl gas and NH₃ gas as shown in FIG. 2 and the pulse feeding time t1 of TMAl gas of 10 seconds, and FIG. 11B a photo of a cross section of the semiconductor device 10 in this case. As for the timing, t3 and t4 of FIG. 2 are the same as those for the fabrication process of the semiconductor device shown in FIG. 10A and FIG. 10B.

Figure 12A:
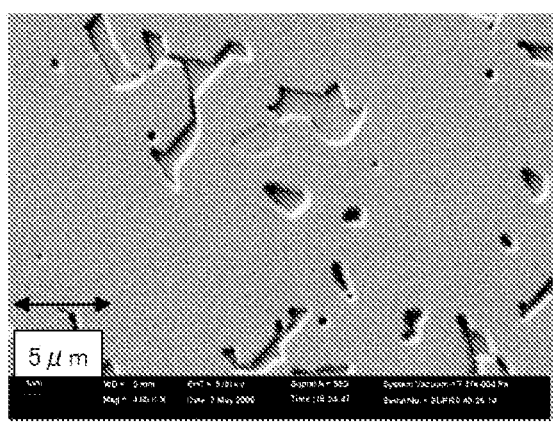
FIG. 12A is a photo of a surface of a semiconductor device of a first embodiment, for which a buffer layer was formed with the feed timing of TMAl gas and NH₃ gas as shown in FIG. 2 and the pulse feeding time $t_1$ of TMAl gas of 15 seconds.
Figure 12B:
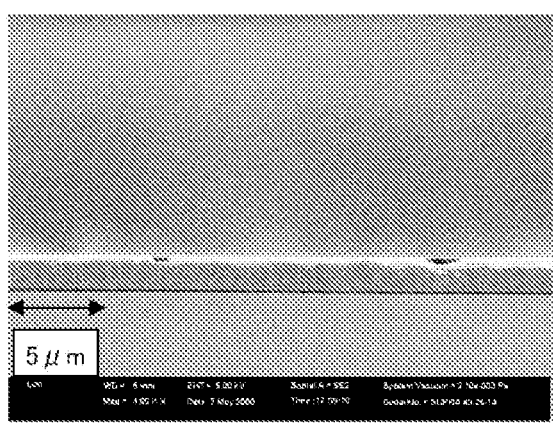
FIG. 12B a photo of a cross section of a semiconductor device in the case of FIG. 12A.

FIG. 12A is a photo of a surface of the semiconductor device 10 according to the first embodiment, for which the buffer layer was formed with the feed timing of TMAl gas and NH₃ gas as shown in FIG. 2 and the pulse feeding time t1 of TMAl gas of 15 seconds, and FIG. 12B a photo of a cross section of the semiconductor device 10 in this case. As for the timing, t3 and t4 of FIG. 2 are the same as those for the fabrication process of the semiconductor device shown in FIG. 10A and FIG. 10B.

Figure 13A:
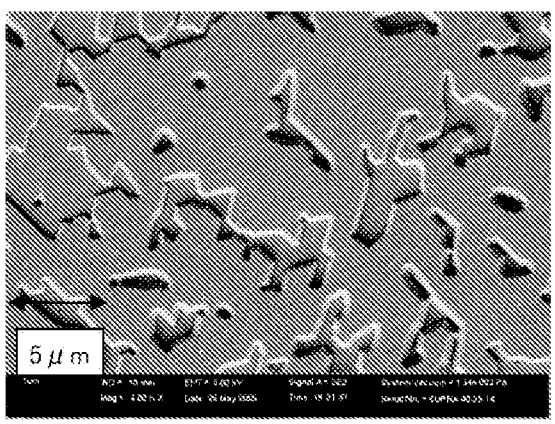
FIG. 13A is a photo of a surface of a semiconductor device according to a first embodiment, for which a buffer layer was formed with the feed timing of TMAl gas and NH₃ gas as shown in FIG. 2 when the pulse feeding time $t_1$ of TMAl gas is 20 seconds.
Figure 13B:
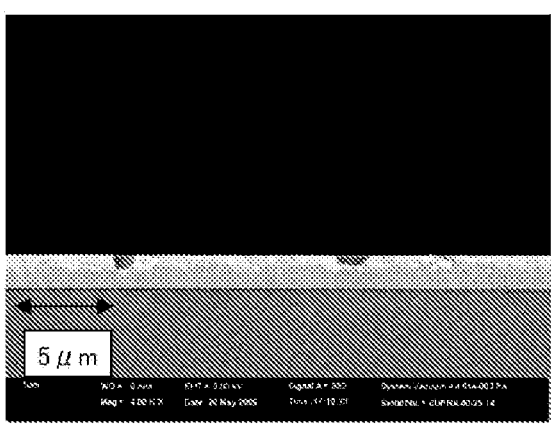
FIG. 13B a photo of a cross section of a semiconductor device 10 in the case of FIG. 13A.

FIG. 13A is a photo of a surface of the semiconductor device 10 according to the first embodiment, for which the buffer layer was formed with the feed timing of TMAl gas and NH₃ gas as shown in FIG. 2 when the pulse feeding time t1 of TMAl gas is 20 seconds, and FIG. 13B a photo of a cross section of the semiconductor device 10 in this case. As for the timing, t3 and t4 of FIG. 2 are the same as those for the fabrication process of the semiconductor device shown in FIG. 10A and FIG. 10B.

When the pulse feeding time t1 is so changed as to be 5 seconds, 10 seconds, 15 seconds, and 20 seconds as mentioned above, the surface unevenness of the GaN layer is reduced to a minimum when the pulse feeding time t1 is 15 seconds as is evident in FIG. 12A and FIG. 12B. It has thus been confirmed that the advantageous effect of the nucleation layer 18 being formed of aluminum is the most marked when t1 is 15 seconds.

Figure 14:
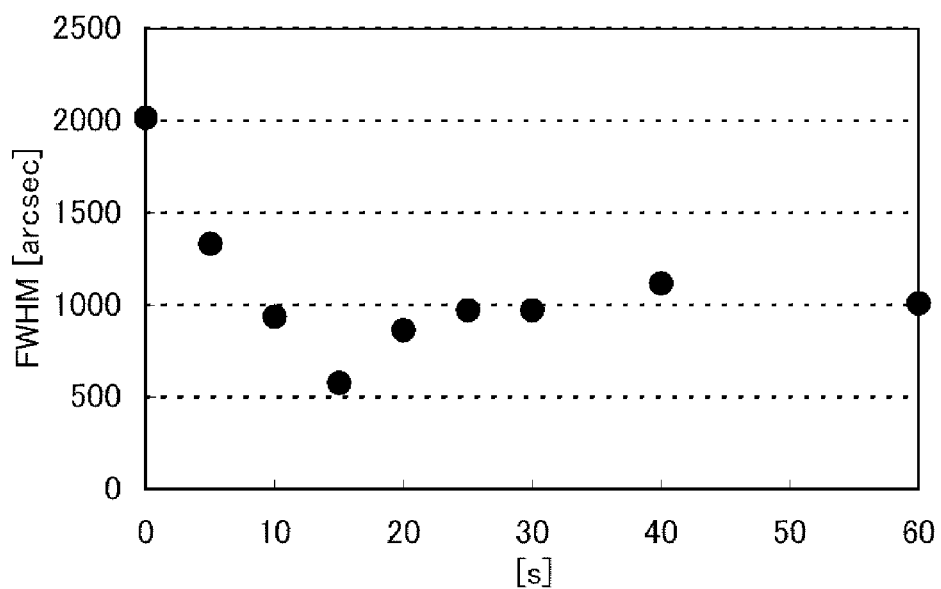
FIG. 14 is a diagram showing a relationship between the pulse feeding time $t_1$ of TMAl gas (horizontal axis) and the half-value width in GaN (0002) rocking curve measurement (vertical axis) of a semiconductor device according to a first embodiment.

FIG. 14 is a diagram showing a relationship between the pulse feeding time t1 of TMAl gas (horizontal axis) and the half-value width in GaN (0002) rocking curve measurement (vertical axis) of the semiconductor device 10 according to the first embodiment. The pulse feeding time t1 was changed from zero seconds to 60 seconds.

As is clear from FIG. 14, the results of GaN (0002) rocking curve measurement show the smallest value of diffraction peak half-value width when the pulse feeding time t1 of TMAl gas is 15 seconds. This indicates that the GaN layer was formed optimally when the pulse feeding time t1 of TMAl gas was 15 seconds.

Figure 15:
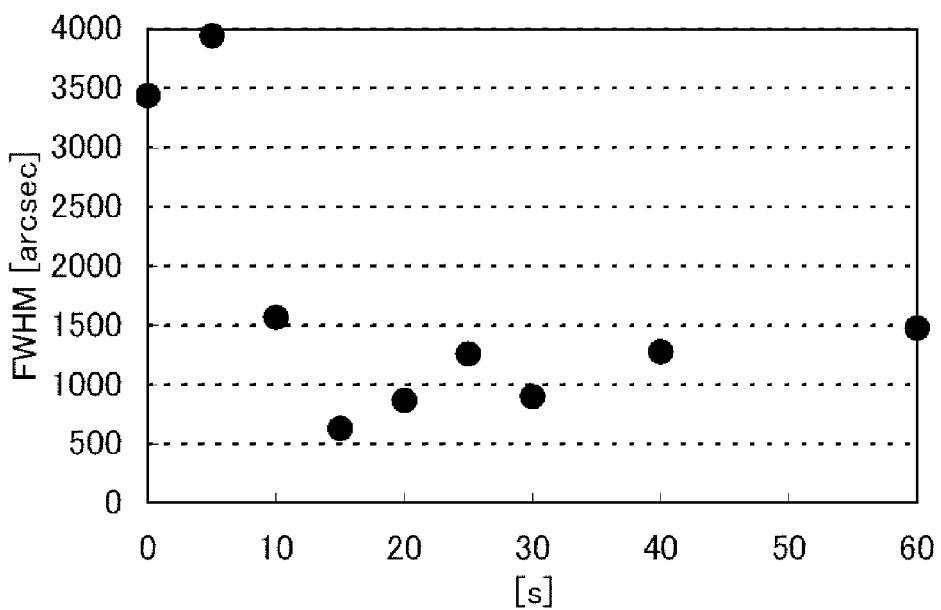
FIG. 15 is a diagram showing a relationship between the pulse feeding time $t_1$ of TMAl gas (horizontal axis) and the half-value width in GaN (10-12) rocking curve measurement (vertical axis) of a semiconductor device according to a first embodiment.

FIG. 15 is a diagram showing a relationship between the pulse feeding time t1 of TMAl gas (horizontal axis) and the half-value width in GaN (10-12) rocking curve measurement (vertical axis) of the semiconductor device 10 according to the first embodiment. The pulse feeding time t1 was changed from zero seconds to 60 seconds.

As is clear from FIG. 15, the results of GaN (10-12) rocking curve measurement also show the smallest value of diffraction peak half-value width when the pulse feeding time t1 of TMAl gas is 15 seconds. This indicates that the GaN layer was formed optimally when the pulse feeding time t1 of TMAl gas was 15 seconds.

Figure 16:
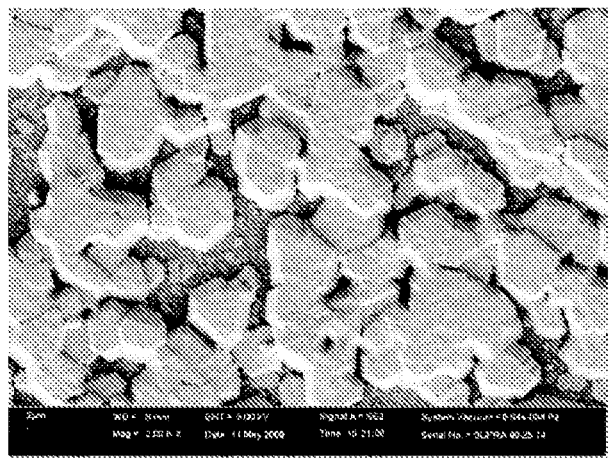
FIG. 16 is a photo of a surface of a semiconductor device of Comparative Example 4 using a YAG substrate of surface orientation (111)

FIG. 16 is a photo of a surface of the semiconductor device of Comparative Example 4 using a YAG substrate of surface orientation (111). FIG. 16 is a representation at a low magnification of the surface photo of Comparative Example 4 shown in FIG. 9A so as to facilitate comparison with other semiconductors. As is evident, the surface of the GaN layer shows a marked unevenness.

Figure 17A:
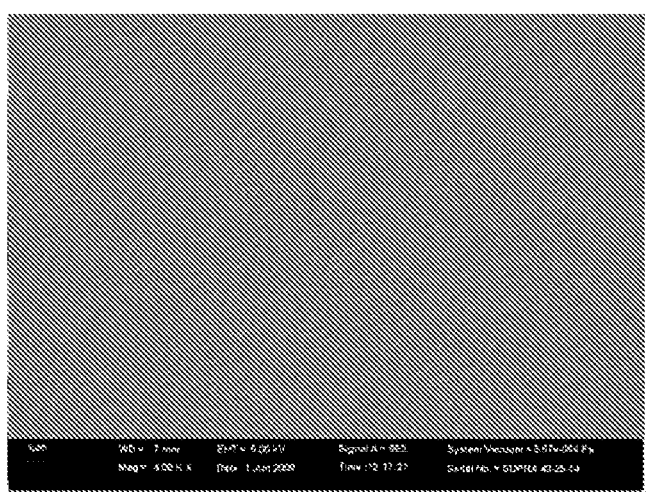
FIG. 17A is a photo of a surface of a semiconductor device according to a first embodiment using a YAG substrate of surface orientation (111)
Figure 17B:
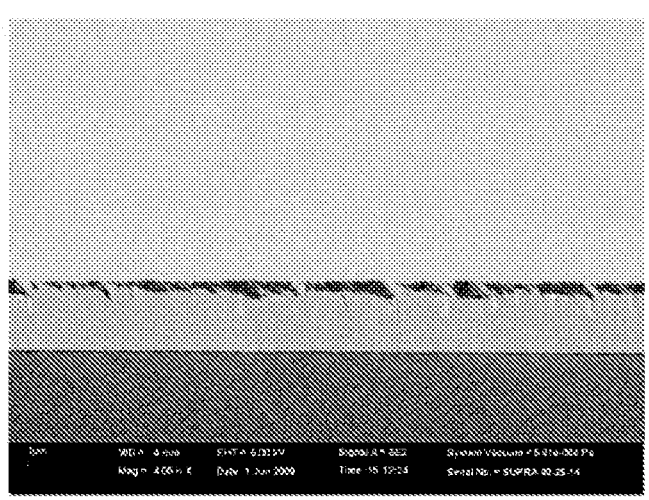
FIG. 17B a photo showing a bird's eye view of a cross section of the semiconductor device of FIG. 17A.

FIG. 17A is a photo of a surface of the semiconductor device 10 according to the first embodiment using a YAG substrate of surface orientation (111), and FIG. 17B a photo showing a bird's eye view of a cross section of the semiconductor device 10. As already described, for the semiconductor device 10 of the first embodiment, a GaN layer is formed after the formation of the buffer layer by feeding TMAl gas and NH₃ gas onto the YAG substrate with the feed timing as shown in FIG. 2. The pulse feeding time t1 of TMAl gas is 15 seconds, which have been confirmed to produce optimal results. As is clear from FIG. 17A and FIG. 17B, when the YAG substrate of surface orientation (111) is used, the pulse feeding of TMAl gas leads to a substantial reduction of surface unevenness of the GaN layer.

Comparative Example 5

FIG. 18 is a photo of a surface of a semiconductor device of Comparative Example 5 using a YAG substrate of surface orientation (110). The fabrication method of the semiconductor device is the same as that of Comparative Example 4 except that a YAG substrate of surface orientation (110) is used. Hence, for the semiconductor device of Comparative Example 5, the GaN layer is formed after the formation of the buffer layer by feeding TMAl gas and NH₃ gas onto the YAG substrate with the feed timing as shown in FIG. 8. As for the timing, t41 and t42 are the same as those for Comparative Example 4. Thus, the semiconductor device of Comparative Example 5 also shows a marked surface unevenness of the GaN layer.

FIG. 19A is a photo of a surface of the semiconductor device 10 according to the first embodiment using a YAG substrate of surface orientation (110), and FIG. 19B a photo of a cross section of the semiconductor device 10. The fabrication method of the semiconductor device shown in FIGS. 19A and 19B is the same as that of the semiconductor device shown in FIGS. 17A and 17B except that a YAG substrate of surface orientation (110) is used. The pulse feeding time t1 of TMAl gas for this example is also 15 seconds, which have been confirmed to produce optimal results when the YAG substrate of surface orientation (111) is used.

As is clear from FIG. 19A and FIG. 19B, when the YAG substrate of surface orientation (110) is used, the pulse feeding of TMAl gas also leads to a substantial reduction of surface unevenness of the GaN layer.

Comparative Example 6

Figure 20:
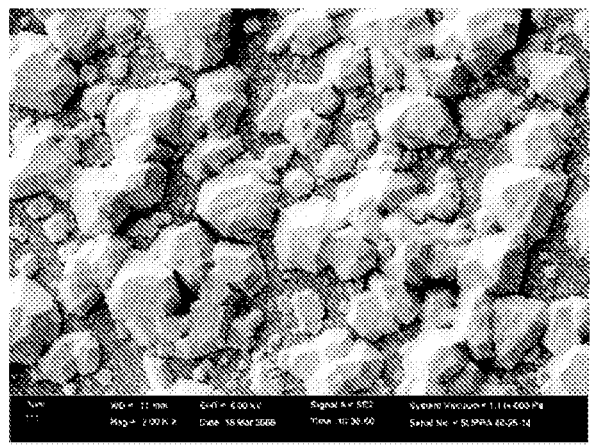
FIG. 20 is a photo of a surface of a semiconductor device of Comparative Example 6 using a YAG substrate of surface orientation (100)

FIG. 20 is a photo of a surface of a semiconductor device of Comparative Example 6 using a YAG substrate of surface orientation (100). The fabrication method of the semiconductor device is the same as that of Comparative Example 4 except that a YAG substrate of surface orientation (100) is used. Hence, for the semiconductor device of Comparative Example 6, the GaN layer is formed after the formation of a buffer layer by feeding TMAl gas and NH$_3$ gas onto the YAG substrate with the feed timing as shown in FIG. 8. As for the timing, t41 and t42 are the same as those for Comparative Example 4. Thus, the semiconductor device of Comparative Example 6 also shows a marked surface unevenness of the GaN layer.

Figure 21A:
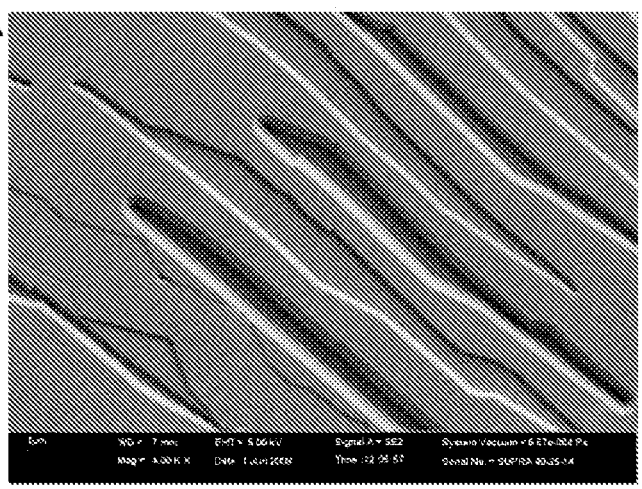
FIG. 21A is a photo of a surface of a semiconductor device according to a first embodiment using a YAG substrate of surface orientation (100)
Figure 21B:
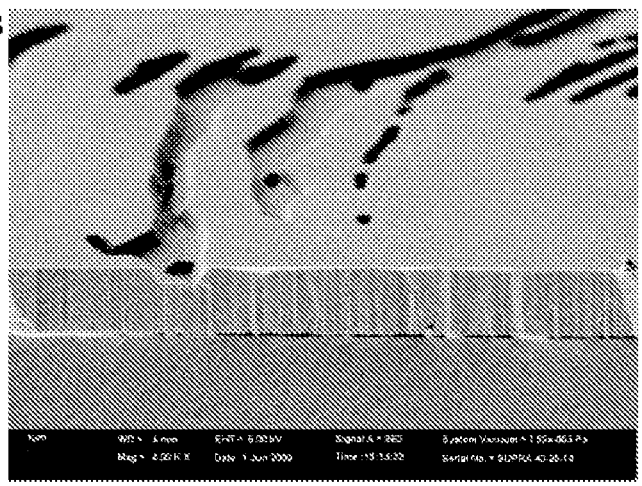
FIG. 21B is a photo showing a bird's eye view of a cross section of the semiconductor device of FIG. 21A.

FIG. 21A is a photo of a surface of the semiconductor device 10 according to the first embodiment using a YAG substrate of surface orientation (100), and FIG. 21B a photo showing a bird's eye view of a cross section of the semiconductor device 10. The fabrication method of the semiconductor device shown in FIGS. 21A and 21B is the same as that of the semiconductor device shown in FIGS. 17A and 17B except that the YAG substrate of surface orientation (100) is used. The pulse feeding time t1 of TMAl gas for this example is also 15 seconds, which have been confirmed to produce optimal results when the YAG substrate of surface orientation (111) is used.

As is clear from FIG. 21A and FIG. 21B, when the YAG substrate of surface orientation (100) is used, the pulse feeding of TMAl gas also leads to a substantial reduction of surface unevenness of the GaN layer. However, a streaky unevenness remains on the surface of the GaN layer. Under the present conditions, therefore, it has been found that the 15 seconds of pulse feeding of TMAl gas produce better results when the YAG substrate of surface orientation (110) or (111) is used than when that of surface orientation (100) is used.

As described above, according to the semiconductor 10 of the first embodiment, the GaN layer, which is a group-III nitride semiconductor layer 16, can be formed properly not only when the YAG substrate of surface orientation (111) is used, but also when the YAG substrate of surface orientation (110) or (100) is used.

Second Embodiment

Figure 22:
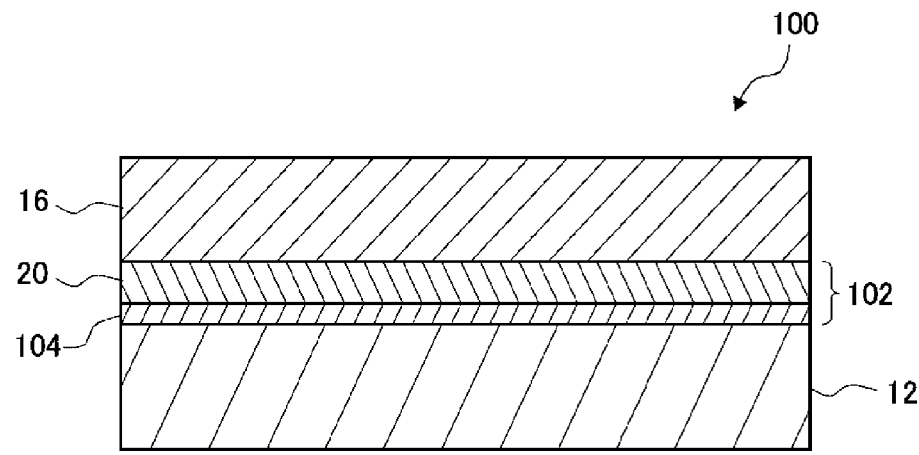
FIG. 22 is a cross-sectional view of a semiconductor device according to a second embodiment of the present invention.

FIG. 22 is a cross-sectional view of a semiconductor device 100 according to a second embodiment of the present invention. Hereinbelow, the structural components identical to those of the first embodiment are given the identical reference numerals, and the repeated description thereof will be omitted as appropriate.

The semiconductor device 100 includes a YAG substrate 12, a buffer layer 102, and a group-III nitride semiconductor layer 16. The buffer layer 102, which contains a group-III-V compound, is formed on the YAG substrate 12. The buffer layer 102 functions as a relaxation layer to effect the single crystal growth of the group-III nitride semiconductor layer 16.

The buffer layer 102 has a nucleation layer 104 and a group-III-V compound layer 20. For the semiconductor device 100 according to the second embodiment, the nucleation layer 104 is formed on the surface of the YAG substrate 12 before the group-III-V compound layer 20 is formed, so that the group-III nitride semiconductor layer 16 can be formed properly whatever YAG substrate 12 having a plurality of surface orientations is used.

The nucleation layer 104 is first formed of aluminum on the YAG substrate 12. It should be appreciated here that the nucleation layer 104 may be formed of another group-III element. The nucleation layer 104 may also be formed of one or more of Al, Ga, and In as the group-III elements. The group-III-V compound layer 20 is formed on the nucleation layer 104. The group-III nitride semiconductor layer 16 is formed through a process of single crystal growth on the surface of the thus formed buffer layer 106.

Figure 23:
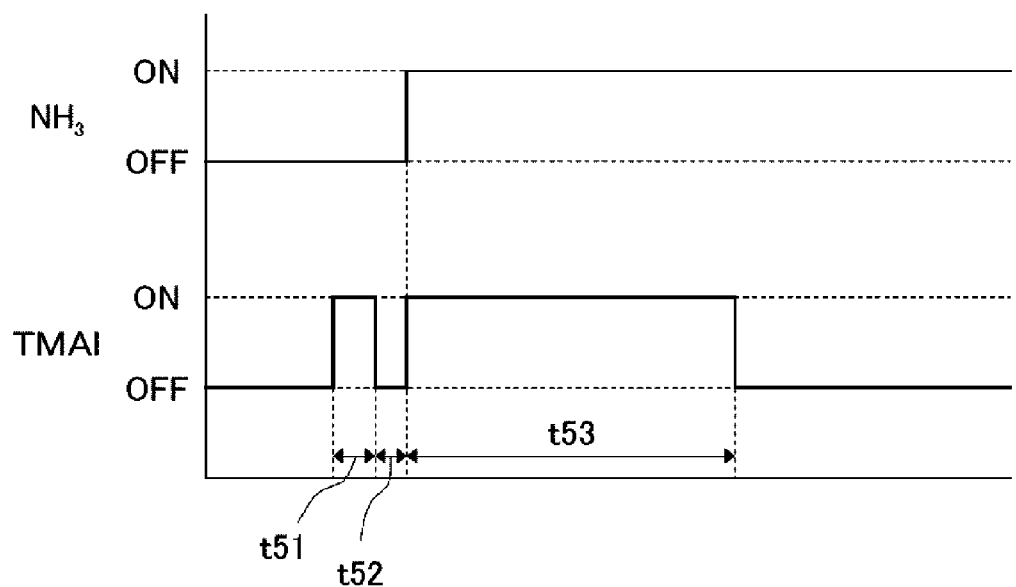
FIG. 23 is a diagram showing the feed timing of TMAl gas and NH₃ gas when forming a buffer layer of a semiconductor device according to a second embodiment of the present invention.

FIG. 23 is a diagram showing the feed timing of TMAl gas and NH$_3$ gas when forming the buffer layer 102 of the semiconductor device 100 according to the second embodiment of the present invention. In the second embodiment, too, the buffer layer 104 is formed by a MOCVD process.

In the second embodiment, the TMAl gas is first fed in pulses onto the YAG substrate 12 without allowing the NH$_3$ gas to be exposed to the surface of the YAG substrate 12. Let t51 represent this pulse feeding time. When time t52 has elapsed from the end of pulse feeding of the TMAl gas, the feeding of both the TMAl gas and the NH$_3$ gas is started. This will supply a mixed gas of TMAl gas and NH$_3$ gas onto the YAG substrate 12. Let t53 represent the feeding time of TMAl gas at this time. The pulse feeding time t51 may be 15 seconds, whereas the feeding time t53 may be 600 seconds.

Figure 24A:
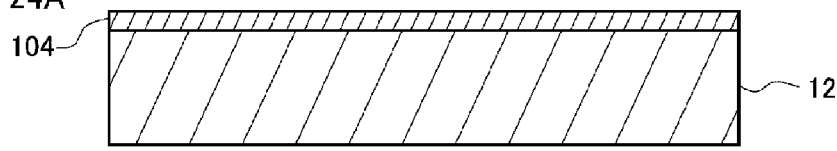
FIGS. 24A to 24C illustrate fabrication processes of a semiconductor device according to a second embodiment of the present invention.
Figure 24B:
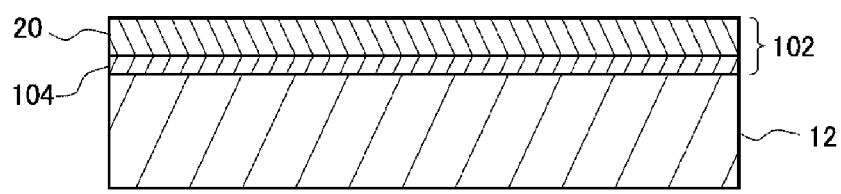
Figure 24C:
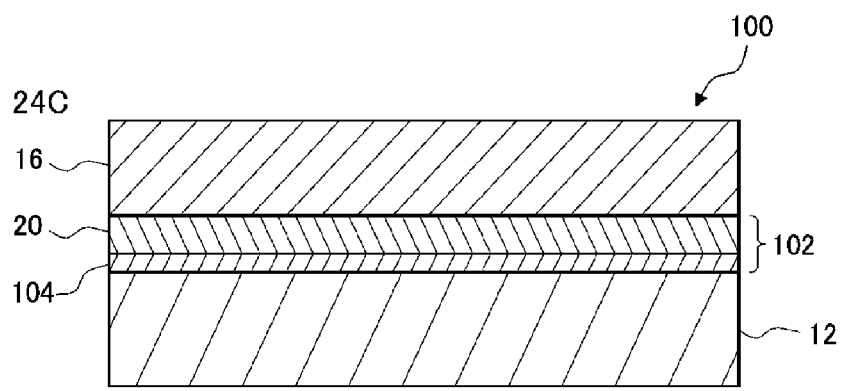

FIGS. 24A to 24C illustrate fabrication processes of the semiconductor device 100 according to the second embodiment of the present invention. FIG. 24A is an illustration showing a state in which a nucleation layer 104 has been formed on the surface of a YAG substrate 12. In the second embodiment, the semiconductor device 100 is fabricated such that the nucleation layer 104 made of aluminum is formed on the YAG substrate 12 by pulse-feeding a TMAl gas containing aluminum, which is a group-III element, onto the surface of the YAG substrate 12 for a pulse feeding time t51. It is to be noted that the nucleation layer 104 may be formed by another film-forming method such as sputtering or vacuum deposition.

FIG. 24B is an illustration showing a state in which the group-III-V compound layer 20 is formed on the nucleation layer 104. After an elapse of t52 from the end of pulse feeding of the TMAl gas, a mixed gas of TMAl gas and NH$_3$ gas is fed, so that the group-III-V compound layer 20 of AlN is stacked on the nucleation layer 18. Thus a buffer layer 102 is constituted by the nucleation layer 104 and the group-III-V compound layer 20.

FIG. 24C is an illustration showing a state in which the group-III-V compound layer 20 has been formed on the buffer layer 102. The group-III nitride semiconductor layer 16 is formed by epitaxially growing the crystal of GaN on the buffer layer 102. As described above, the group-III-V compound layer 20 is directly formed on the nucleation layer 104 made of a group-III element. In the second embodiment, too, a preferable group-III nitride semiconductor layer 16 with little surface unevenness is formed.

Third Embodiment

Figure 25:
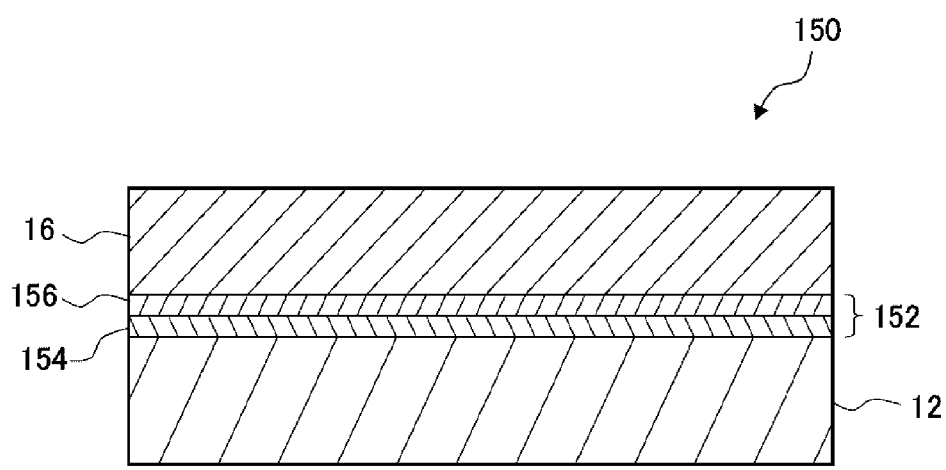
FIG. 25 is a cross-sectional view of a semiconductor device according to a third embodiment of the present invention.

FIG. 25 is a cross-sectional view of a semiconductor device 150 according to a third embodiment of the present invention. Hereinbelow, the structural components identical to those of the first embodiment are given the identical reference numerals, and the repeated description thereof will be omitted as appropriate.

The semiconductor device 150 includes a YAG substrate 12, a buffer layer 152, and a group-III nitride semiconductor layer 16. The buffer layer 152, which contains a group-III-V compound, is formed on the YAG substrate 12. The buffer layer 152 functions as a relaxation layer to effect the single crystal growth of the group-III nitride semiconductor layer 16.

The buffer layer 152 has a group-III nucleation layer 154 and a group-III-V compound layer 156. For the semiconductor device 150 according to the third embodiment, a nucleation layer made of aluminum, which is a group-III element, is first formed on the surface of the YAG substrate 12, so that the group-III nitride semiconductor layer 16 can be formed properly whatever YAG substrate 12 having a plurality of surface orientations is used. The nucleation layer may also be formed of one or more of Al, Ga, and In as the group-III elements. The surface of the nucleation layer is combined with a group-V element, and the group-III-V compound layer 156 is formed on the surface of the nucleation layer. A partial region of the nucleation layer left there without being combined with the group-V element becomes the group-III nucleation layer 154. Note that the entire nucleation layer may be combined with a group-V element and therefore no group-III nucleation layer 154 may be left there. Thereby, the buffer layer 152 is constituted by the group-III nucleation layer 154 and the group-III-V compound layer 156. The group-III nitride semiconductor layer 16 is formed through a process of single crystal growth on the surface of the thus formed buffer layer 152.

Figure 26:
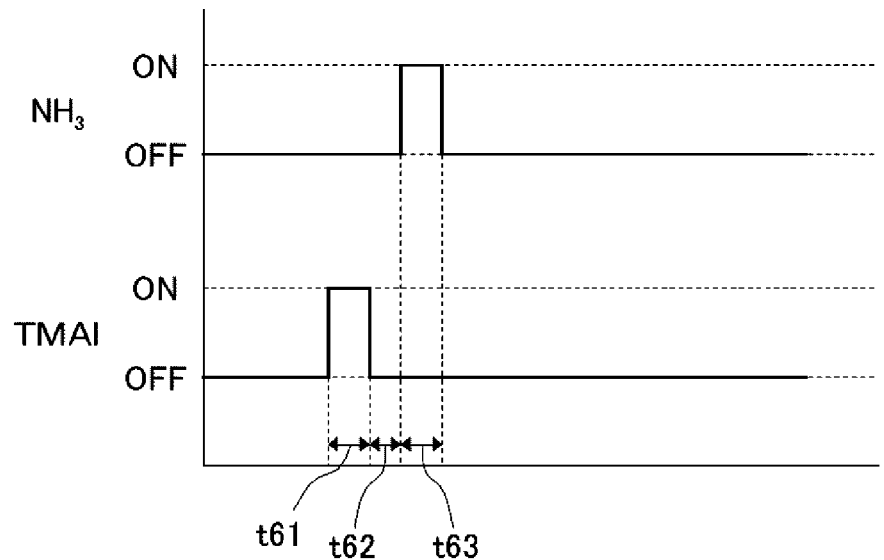
FIG. 26 is a diagram showing the feed timing of TMAl gas and NH₃ gas when forming a buffer layer of a semiconductor device according to a third embodiment of the present invention.

FIG. 26 is a diagram showing the feed timing of TMAl gas and NH$_3$ gas when forming the buffer layer 152 of the semiconductor device 150 according to the third embodiment of the present invention. In the third embodiment, the TMAl gas is first fed in pulses onto the YAG substrate 12 without allowing the NH$_3$ gas to be exposed to the surface of the YAG substrate 12. Let t61 represent this pulse feeding time. When time t62 has elapsed from the end of pulse feeding of the TMAl gas, the NH$_3$ gas is fed for time t63. As a result, the surface of the nucleation layer 154 is combined with a group-V element, and the group-III-V compound layer 156 is formed on the surface the nucleation layer 154. The pulse feeding time t61 may be 15 seconds, whereas the feeding time t63 may be 5 minutes.

Figure 27A:
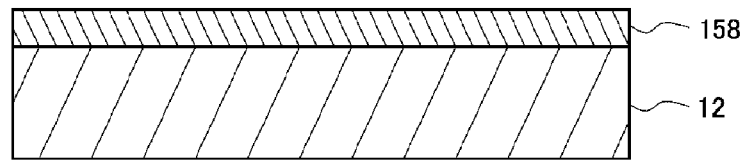
FIG. 27A to 27C illustrate fabrication processes of a semiconductor device according to a third embodiment of the present invention
Figure 27B:
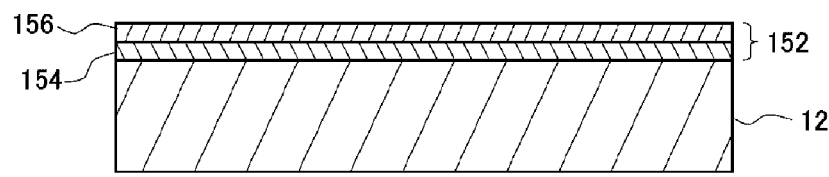
Figure 27C:
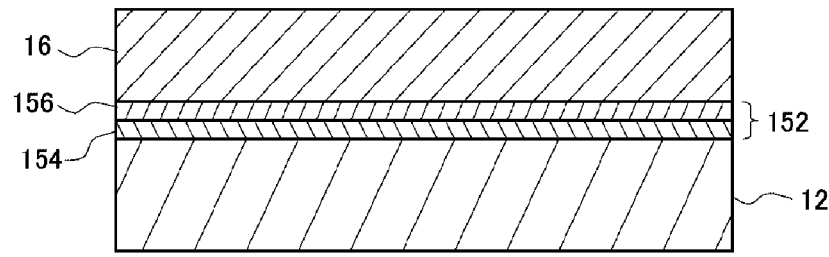

FIG. 27A to 27C illustrate fabrication processes of the semiconductor device 150 according to the third embodiment of the present invention. FIG. 27A is an illustration showing a state in which a nucleation layer 158 has been formed on the surface of a YAG substrate 12. In the third embodiment, the semiconductor device 150 is fabricated such that the nucleation layer 158 made of aluminum is formed on the YAG substrate 12 by pulse-feeding a TMAl gas containing aluminum, which is a group-III element, onto the surface of the YAG substrate 12 for a pulse feeding time t61. It is to be noted that the nucleation layer 158 may be formed by another film-forming method such as sputtering or vacuum deposition.

FIG. 27B is an illustration showing a state in which the surface of the nucleation layer 158 is changed to the group-III compound layer 156 after it has been combined with a group-V element. After an elapse of t62 from the end of pulse feeding of the TMAl gas, the NH$_3$ gas is fed onto the nucleation layer 158 and thereby the surface of the nucleation layer 158 is turned into a group-V compound by a group-V element; as a result, the group-III-V compound layer 156 of AlN is formed. Thus the buffer layer 152 is constituted by the group-III-V compound layer 156 and the group-III nucleation layer 154, which is a partial region left without being combined with a group-V element. Note that the entire nucleation layer may be combined with a group-V element and therefore no group-III nucleation layer 154 may be left there.

FIG. 27C is an illustration showing a state in which the group-III compound layer 16 has been formed on the buffer layer 152. The group-III nitride semiconductor layer 16 is formed by epitaxially growing the crystal of GaN on the buffer layer 152. As described above, the group-III-V compound layer 156 is formed in such a manner that the surface of the nucleation layer 158 is turned into the group-III compound layer 156 after it has been combined with a group-V element. In this third embodiment, too, a preferable group-III nitride semiconductor layer 16 with little surface unevenness is formed.

The present invention is not limited to each of the above-described embodiments only, and those resulting from any combination of the respective elements as appropriate are effective as embodiments.

Also, it is understood by those skilled in the art that various modifications such as changes in design may be added to each of the embodiments based on their knowledge and the embodiments added with such modifications are also within the scope of the present invention.

What is claimed is:

1. A method for fabricating a semiconductor device, the method comprising:
   forming a buffer layer containing a group-III-V compound, on a light emitting ceramic substrate formed of $Y_3Al_5O_{12}$ having a plurality of surface orientations; and
   forming a group-III nitride semiconductor layer on the buffer layer, wherein
   the forming the buffer layer includes:
   a first step of feeding a first gas containing Al as a group-III element to the substrate in pulses and forming a nucleation layer made of Al in at least a part on the substrate;
   a second step of stopping a supply of the first gas and feeding a second gas containing a group-V element to the substrate; and
   a third step of resuming the supply of the first gas while continuing to feed the second gas.

2. A method for fabricating a semiconductor device according to claim 1, wherein the forming a buffer layer further includes changing at least a part of the surface of the nucleation layer into AlN by combining the at least a part of the surface of the nucleation layer with a group V element.

3. A method for fabricating a semiconductor device according to claim 2, wherein the at least a part of the surface of the nucleation layer is changed into a group-III-V compound by supplying the second gas containing a group-V element onto the nucleation layer.

4. A method for fabricating a semiconductor device according to claim 1, wherein the forming a buffer layer further includes forming a group-III-V compound layer on the nucleation layer.

5. A method for fabricating a semiconductor device according to claim 4, wherein the group-III-V compound layer is formed on the nucleation layer by supplying a third gas containing both of a group-III element and a group-V element onto the nucleation layer.

6. A method for fabricating a semiconductor device according to claim 1, further comprising forming another of the buffer layer on the buffer layer.

7. A method for fabricating a semiconductor device according to claim 1, wherein the substrate is such that part of Y is replaced by any of Lu, Sc, La, Gd, and Sm and/or part of Al is replaced by any of In, B, Tl, and Ga.

8. A method for fabricating a semiconductor device according to claim 1, wherein the substrate contains at least one type of activator selected from the group consisting of Ce, Tb, Eu, Ba, Sr, Mg, Ca, Zn, Si, Cu, Ag, Au, Fe, Cr, Pr, Nd, Dy, Co, Ni, and Ti.

9. A method for fabricating a semiconductor device according to claim 8, wherein the activator contains $Ce^{3+}$.

10. A method for fabricating a semiconductor device according to claim 8, wherein the activator contains $Tb^{2+}$.

11. A method for fabricating a semiconductor device according to claim 8, wherein the activator contains $Eu^{2+}$.

\* \* \* \* \*